United States Patent [19]

Takeyama

[11] Patent Number: 5,218,209
[45] Date of Patent: Jun. 8, 1993

[54] ION IMPLANTER
[75] Inventor: Kunihiko Takeyama, Kyoto, Japan
[73] Assignee: Nissin High Voltage Co., Ltd., Kyoto, Japan
[21] Appl. No.: 826,141
[22] Filed: Jan. 27, 1992
[30] Foreign Application Priority Data Feb. 5, 1991 [JP] Japan .................... 3-35148

[51] Int. Cl.⁵ .............................. G21K 5/10
[52] U.S. Cl. ..................... 250/440.11; 250/442.11; 269/238
[58] Field of Search ............ 250/440.11, 442.11, 250/492.21; 269/238

[56] References Cited
U.S. PATENT DOCUMENTS 4,817,556  4/1989  Mears et al. ................ 269/238
5,040,484  8/1991  Mears et al. ................ 269/238

*Primary Examiner*—Bruce C. Anderson
*Attorney, Agent, or Firm*—Finnegan, Henderson, Farabow, Garrett & Dunner

[57] ABSTRACT

An ion implanter for implanting ions into a batch of semiconductor wafers comprises a wafer holding disk of the centrifugal holding type, and a plurality of wafer rests in the wafer holding disk having a wafer holding surface which is conically curved. When the wafer holding disk is rotated, the wafer is pushed onto the wafer holding surface so that the surface of the wafer is curved nearly in the same manner as the conically-curved inner surface of the peripheral portion of the wafer holding disk. As a result, an ion beam being irradiated upon the surface of the wafer is always perpendicular to the surface of the wafer.

4 Claims, 2 Drawing Sheets

ION IMPLANTER

BACKGROUND OF THE INVENTION

1. Field of the Invention

The present invention relates to an ion implanter having a

2. Discussion of the Related Art

FIGS. 4, 5 and 6 show a conventional ion planter which implants ions into a batch of semiconductor wafers 2 held on a wafer holding disk 1 by a centrifugal force. The peripheral portion 1a of the wafer holding disk 1 is conically curved. The inner surface of the peripheral portion 1a has a plurality of shallow recesses 1b which are wafer rests. When the disk 1 is rotated as the wafers 2 are in the wafer rests 1b, the wafers are pushed onto the wafer holding bottoms 1c of the rests so that the wafers are held on the disk. At the same time, an ion beam 3 is irradiated upon the wafer 2 in a direction shown in the drawings, to implant ions into the wafer. The beam 3 is irradiated upon the wafer 2 perpendicular to the conically-curved inner surface of the peripheral portion 1a of the disk 1. The disk is moved in a direction C as shown by one-dot chain lines in FIG. 4, so that the ions are implanted into the entire top surface of the wafer 2.

The wafer holding bottom 1c of each wafer rest 1b of the wafer holding disk 1 of the conventional ion implanter is a plane surface substantially circumscribed on the curve of the conically-curved inner surface of the peripheral portion 1a of the disk. Consequently, the wafer 2 is flatly held on the flat bottom 1c of the wafer rest 1b by the centrifugal force as the ion beam 3 is irradiated upon the wafer. For that reason, although the ion beam 3 strikes the top surface of the wafer 2 perpendicular to the surface at the center thereof, the angle of the beam to the surface deviates from the perpendicular off the center of the surface, as shown in FIG. 3. The deviation increases in proportion to the distance between the center of the top surface of the wafer 2 and the point of the irradiation of the ion beam 3 upon the surface, and becomes the maximum $\delta$ at both ends of the surface in the circumferential direction of the disk. This change in the angle of the irradiation of the ion beam 3 upon the wafer 2 results in altering the position, density, and distribution of the ions implanted in the wafer. If the diameter of the wafer 2 is small, the change in the angle is negligible. However, if the diameter of the wafer 2 is as large as 150 to 200 mm and/or the degree of integration of a semiconductor device made from the wafer rises, as in recent years, the implantation of the ions is required to be more accurate, namely, the deviation in the angle of the irradiation is not negligible and poses a problem in attaining uniformity of the quality of the ion-implanted wafer.

SUMMARY OF THE INVENTION

The present invention has been made in view of the above circumstances and has as an object to provide an ion implanter capable of implanting ions into the entire top surface of a wafer in a wafer rest at a constant angle to the surface despite the revolution of the wafer.

A further object of the invention is to implant ions into a wafer in a manner resulting in a uniform distribution of ions throughout the surface of the wafer.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the ion implanter of this invention comprises a centrifugal type wafer holding disk having a conically curved peripheral portion, and a plurality of wafer rests aligned along the peripheral portion of the wafer holding disk wherein the bottom holding surfaces of the wafer rests are curved nearly in the o shape of the conically curved peripheral portion of the wafer holding disk.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
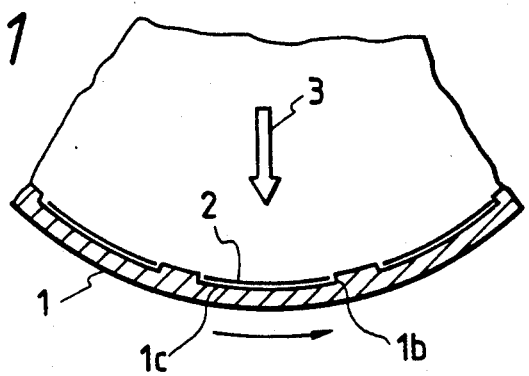
FIG. 1 is a fragmentary cross-sectional view of the wafer holding portion of an ion implanter of the present invention comparable to the view of FIG. 6 taken along a line B—B shown in FIG. 5.

The ion implanter shown in FIG. 1 has a wafer holding disk 1 of the centrifugal holding type, and is characterized in that each wafer rest 1b of the disk 1 has a wafer holding surface 1c curved nearly in the same manner as the conically-curved inner surface of the disk 1.

Since wafer rest 1b of the wafer holding disk 1 of the ion implanter provided in accordance with the present invention has the wafer holding surface 1c curved nearly in the same manner as the conically-curved inner surface of the disk 1, the wafer 2 is pushed onto the wafer holding surface 1c by a centrifugal force due to the rotation of the disk so that the top surface of the wafer is conically curved. For that reason, an ion beam 3 is irradiated upon the entire top surface of the wafer 2 always perpendicular to the surface, namely, the angle of the implantation of the ions into the surface does not deviate.

Figure 2:
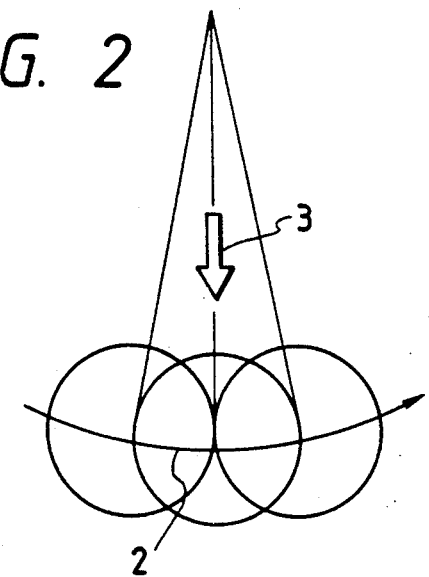
FIG. 2 is a schematic view illustrating the angle of irradiation of an ion beam on a wafer by the ion implanter of the present invention.
Figure 3:
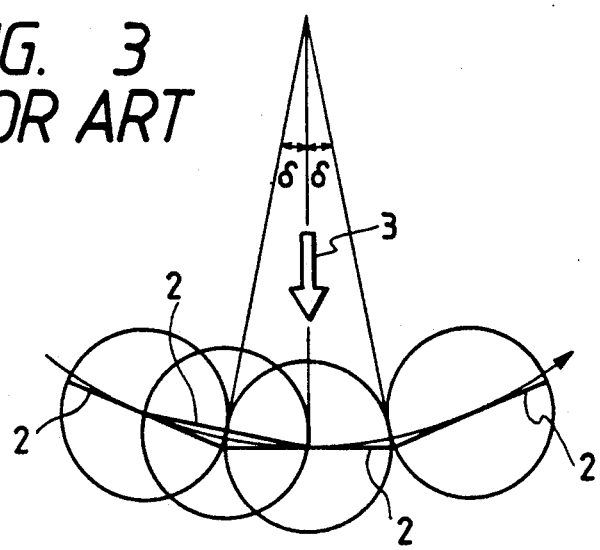
FIG. 3 is a schematic view illustrating the angle of irradiation of an ion beam on a wafer by a conventional ion implanter.
Figure 4:
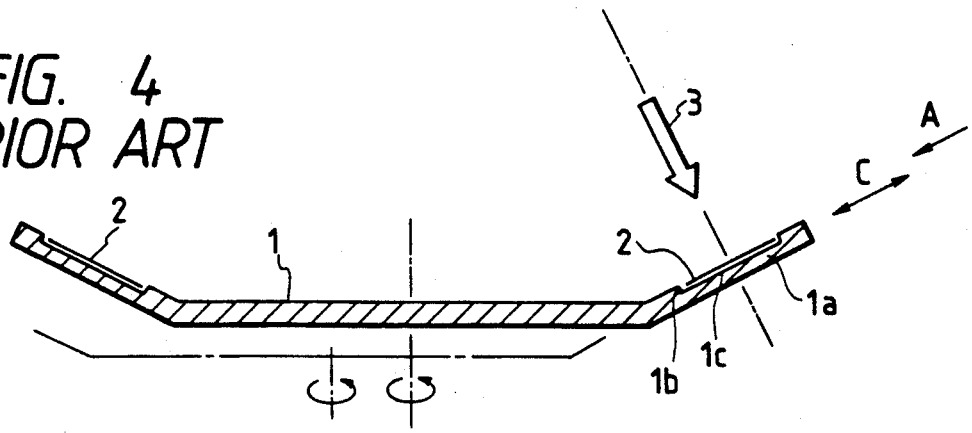
FIG. 4 is a cross-sectional view of a wafer holding disk of the conventional ion implanter.
Figure 5:
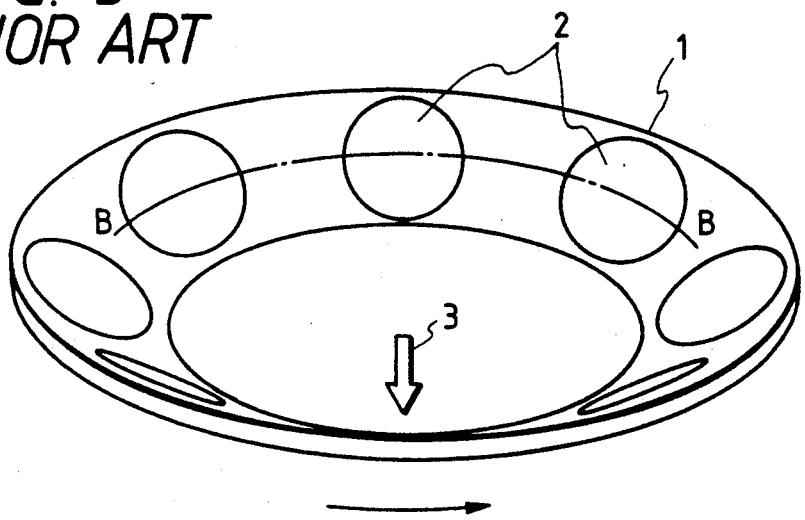
FIG. 5 is a perspective view of the wafer holding disk of the conventional ion implanter seen in a direction A shown in FIG. 4.
Figure 6:
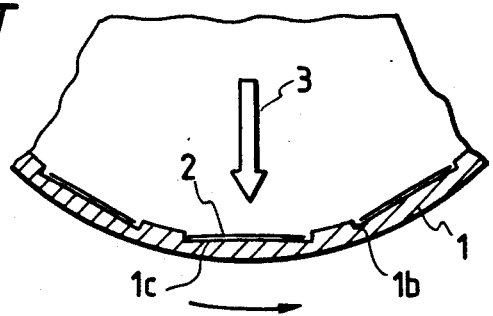
FIG. 6 is a fragmentary cross-sectional view of the wafer holding portion of the conventional ion implanter along a line B—B shown in FIG. 5.

A preferred embodiment of the present invention is hereafter described with reference to FIGS. 1 and 2. FIG. 1 corresponds to FIG. 6, and shows a section of the wafer holding disk 1 of the ion implanter in the circumferential direction of the disk along the line B—B shown in FIG. 5. The disk 1 has wafer rests 1b, in turn, having wafer holding bottoms 1c on which wafers 2 are held. Each wafer holding bottom 1c is a curved surface defined by a cone having the same axis and slope as the conically-curved inner surface of the peripheral portion 1a of the wafer holding disk 1. When the disk 1 is rotated, each wafer 2 is pushed onto the wafer holding bottom 1c of the wafer rest 1b by centrifugal force so that the surface of the wafer is curved to conform with the wafer holding bottom. For that reason, an ion beam 3 is irradiated upon the surface of the wafer 2 perpendicularly to the surface at any point thereon with regard to the circumferential direction of the disk 1, as shown in FIG. 2. In other words, the angle of implantation of ions to the wafer 2 by the implanter does not deviate from the perpendicular.

If such a wafer 2 is held on a spherically curved rest (not shown) by an annular clamper at the time of the implantation of ions into the wafer, the wafer 2 is spherically curved so that the maximum deformation of the peripheral edge of the wafer relative to the center thereof is nearly as large as 1 mm. As for the ion implanter of the present embodiment, the wafer 2 is not spherically curved but conically curved so that the influence of the curving on the quality of the ion-implanted wafer 2 is much smaller than that of the spherical curving of the former wafer, as understood through the examination of the case that when pieces of paper are wound on a conically or cylindrically curved surface and a spherically curved surface, respectively, the piece of paper wound on the former surface does not wrinkle while the other piece of paper wound on the latter surface wrinkles. For example, even if the wafer 2 is 200 mm in diameter and is deformed by about several millimeters at its peripheral edge relative to its center at the time of the curving and holding of the wafer on the wafer holding bottom 1c of the wafer rest 1b, the quality of the ion-implanted wafer is not affected by the deformation.

The wafer holding surface 1c of each wafer rest 1b of the wafer holding disk 1 of an ion implanter provided in accordance with the present invention is a conically curved surface on which a wafer 2 is pushed by centrifugal force due to the rotation of the disk so that the beam-irradiated surface of the wafer 2 is conically curved to correspond to the wafer holding surface 1c of the wafer rest 1b and the inner surface of the peripheral portion of the disk. For that reason, an ion beam 3 is irradiated upon the surface of the wafer 2 perpendicularly to the entire surface, namely, the angle of the implantation of ions into the surface does not deviate. This results in enhancing the accuracy of the implantation of the ions into the wafer to heighten the uniformity of the quality of the wafer.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An ion implanter for implanting ions into a batch of semiconductor wafers, comprising:
   a centrifugal type wafer holding disk having a conically curved peripheral portion;
   a plurality of wafer rests aligned along the peripheral portion of said wafer holding disk, wherein the bottom holding surfaces of said wafer rests are curved nearly in the shape of said conically curved peripheral portion of said wafer holding disk.

2. The ion implanter of claim 1, wherein said plurality of wafer rests each have a diameter of at least 150 mm.

3. A semiconductor wafer holding disk for an ion implanter, comprising:
   a plurality of wafer rests aligned around the periphery of the semiconductor wafer holding disk, each wafer rest having a bottom holding surface which is conically curved.

4. An ion implanter for implanting ions into a batch of semiconductor wafers, comprising:
   a centrifugal type wafer holding disk having a conically curved peripheral portion;
   a plurality of wafer rests aligned around said peripheral portion of said wafer holding disk, said wafer rests having a bottom holding surface which is a fragment of a conical surface having the same axis and slope as said conically curved peripheral portion of said wafer holding disk.

* * * * *